US008441318B2

(12) United States Patent
Tsai et al.

(10) Patent No.: US 8,441,318 B2
(45) Date of Patent: May 14, 2013

(54) PUSH-PULL LOW NOISE AMPLIFIER WITH VARIABLE GAIN, PUSH-PULL LOW NOISE AMPLIFIER WITH COMMON GATE BIAS CIRCUIT AND AMPLIFIER WITH AUXILIARY MATCHING

(75) Inventors: Ming-Da Tsai, Miaoli County (TW); Yu-Hsin Lin, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 99 days.

(21) Appl. No.: 13/109,000

(22) Filed: May 17, 2011

(65) Prior Publication Data

US 2012/0154045 A1    Jun. 21, 2012

Related U.S. Application Data

(60) Provisional application No. 61/423,162, filed on Dec. 15, 2010.

(51) Int. Cl.
*H03F 3/45* (2006.01)
(52) U.S. Cl.
USPC ............................ 330/253; 330/255; 330/264
(58) Field of Classification Search ............... 330/253, 330/255, 260, 262–265, 267, 269, 271, 291
See application file for complete search history.

(56) References Cited

U.S. PATENT DOCUMENTS

| 7,952,430 B1 * | 5/2011 | Beffa ............................. 330/260 |
| 2005/0164669 A1 | 7/2005 | Molnar |
| 2010/0019848 A1 * | 1/2010 | Rossi ............................. 330/253 |
| 2010/0291881 A1 * | 11/2010 | Brunn et al. .................. 330/269 |

OTHER PUBLICATIONS

Orsatti, "A 71-MHz CMOS IF-Baseband Strip for GSM", IEEE Journal of Solid-State Circuits, Jan. 2000, vol.: 35 Issue:1, pp. 104-108, Jan. 2000.
Nakajima, "A scalable wideband low-noise amplifier consisting of CMOS inverter circuits for multi-standard RF receivers", 2009 3rd International Conference on Signals, Circuits and Systems (SCS), Nov. 6-8, 2009, pp. 1-4, Nov. 2009.
Tenbroek, "Single-Chip Tri-Band WCDMA/HSDPA Transceiver without External SAW Filters and with Integrated TX Power Control", Solid-State Circuits Conference, 2008. ISSCC 2008. Digest of Technical Papers. IEEE International, Feb. 3-7, 2008, pp. 202-203, 607, Feb. 2008.
Robert, "Wide-band variable-gain LNA in 65 nm CMOS with inverter based amplifier for multi-tuners cable TV reception", ESSCIRC, 2009. ESSCIRC '09. Proceedings of, Sep. 14-18, 2009, pp. 104-107, Sep. 2009.

* cited by examiner

*Primary Examiner* — Khanh V Nguyen
(74) *Attorney, Agent, or Firm* — Winston Hsu; Scott Margo

(57) ABSTRACT

A push-pull low noise amplifier (LNA) includes at least one amplifier block. Each amplifier block includes a bypass stage and at least one gain cell. The bypass stage has a first node and a second node. The gain cell has an input terminal and an output terminal, comprising a loading stage and a driving stage. When the push-pull LNA is in a first gain mode, the loading stage is enabled and the bypassing stage is disabled; and when the push-pull LNA is in a second gain mode, the loading stage is disabled and the bypassing stage is enabled.

22 Claims, 14 Drawing Sheets

PUSH-PULL LOW NOISE AMPLIFIER WITH VARIABLE GAIN, PUSH-PULL LOW NOISE AMPLIFIER WITH COMMON GATE BIAS CIRCUIT AND AMPLIFIER WITH AUXILIARY MATCHING

CROSS REFERENCE TO RELATED APPLICATIONS

This application claims the benefit of U.S. Provisional Application No. 61/423,162, filed on Dec. 15, 2010 and included herein by reference.

BACKGROUND OF THE INVENTION

1. Field of the Invention

The present invention relates to a low noise amplifier (LNA), and more particularly, to an LNA with variable gain, common gate bias circuit and auxiliary matching mechanism.

2. Description of the Prior Art

Low noise amplifiers (LNAs) are essential building blocks in wireless receivers, especially for those systems seeking more compact and power-efficient performance. To achieve a compact solution, a wireless GSM receiver must utilize a highly linear LNA to avoid SAW (surface acoustic wave) filters. In order to obtain high linearity, conventional LNAs utilize inductors for loading and degeneration to achieve linearity and matching simultaneously, where the inductors are large in size and impossible to shrink no matter how advanced the semiconductor process.

In addition, some conventional receivers require a variable gain range for wideband applications. In this case, conventional LNAs usually utilize a shunt-shunt feedback to achieve a variable gain range in exchange of a maximum gain. The amount of the feedback signal has a great influence on input matching and linearity, meaning that certain issues may occur when the conventional LNAs alter their gain values. Moreover, the shunt-shunt feedback is based on a voltage mode operation, which is not suitable for a SAWless receiver due to linearity issues.

SUMMARY OF THE INVENTION

In light of this, the present invention provides an LNA with a variable gain as well as a high linearity.

According to a first aspect of the present invention, a push-pull low noise amplifier (LNA) including at least one amplifier block is disclosed. Each amplifier block includes a bypass stage and at least one gain cell. The bypass stage has a first node and a second node. The gain cell has an input terminal and an output terminal, comprising a loading stage and a driving stage. The loading stage has an output node coupled to the output terminal, a first node coupled to the first node of the bypass stage and a second node coupled to the second node of the bypass stage. The driving stage has an input node coupled to the input terminal, a first driving node coupled to the first node of the loading stage and a second driving node coupled to the second node of the loading stage. When the push-pull LNA is in a first gain mode, the loading stage is enabled and the bypassing stage is disabled; and when the push-pull LNA is in a second gain mode, the loading stage is disabled and the bypassing stage is enabled.

According to a second aspect of the present invention, a push-pull LNA is disclosed. The LNA includes at least one gain cell and at least one common gate (CG) bias circuit. The gain cell has an input terminal, an output terminal, and includes a loading stage and a driving stage. The loading stage has an output node coupled to the output terminal, a first node, and a second node. The driving stage has an input node coupled to the input terminal, a first driving node coupled to the first node of the loading stage and a second driving node coupled to the second node of the loading stage. The CG bias circuit includes a CG transistor, a resistor and a direct current (DC) choke element. The CG transistor has a control node for receiving a bias voltage, a first node for receiving a first bias current and a second node. The resistor has a first node coupled to the second node of the CG transistor and a second node coupled to the output terminal of the at least one gain cell. The DC choke element has a first node coupled to the first node of the CG transistor and a second node coupled to a control node of at least one transistor of the driving stage.

According to a third aspect of the present invention, an amplifier is disclosed. The amplifier includes at least one amplifier block and at least one auxiliary matching circuit. The amplifier block has an input terminal and an output terminal. The auxiliary matching circuit has a matching node coupled to the input terminal of the amplifier block, and includes a gain cell and a feedback cell. The gain cell has a first node coupled to the matching node of the auxiliary matching circuit and a second node. The feedback cell has a first node coupled to the second node of the gain cell and a second node coupled to the matching node of the auxiliary matching circuit. The second node of the gain cell and the first node of the feedback cell are electrically isolated from the output terminal of the amplifier block.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but in function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
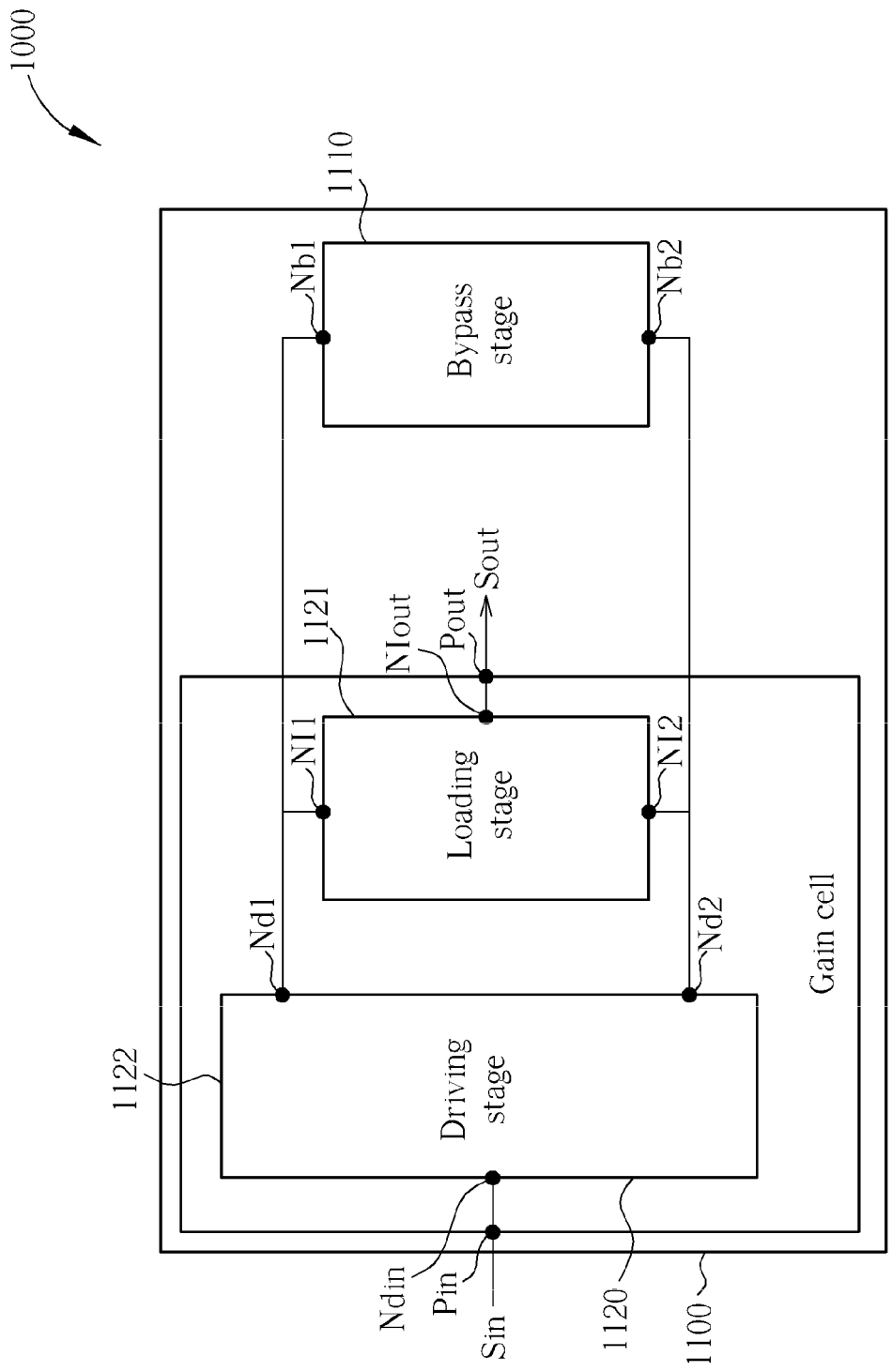
FIG. 1 is a diagram of a push-pull LNA according to an embodiment of the present invention.

Please refer to FIG. 1, which is a diagram of a push-pull low noise amplifier (LNA) 1000 according to an embodiment of the present invention. As shown in FIG. 1, the push-pull LNA 1000 includes (but is not limited to) an amplifier block 1100. The amplifier block 1100 includes a bypass stage 1110 and a gain cell 1120. Please note that the amplifier block 1100 may also include multiple gain cells in other embodiments, and those design choices are dependent upon different specification requirements. The bypass stage 1110 has a first node Nb1 and a second node Nb2, the gain cell 1120 has an input terminal Pin for receiving an input signal Sin and an output terminal Pout for outputting an output signal Sout, and includes a loading stage 1121 and a driving stage 1122. The loading stage 1121 has an output node Nlout coupled to the output terminal Pout, a first node Nl1 coupled to the first node Nb1 of the bypass stage 1110 and a second node Nl2 coupled to the second node Nb2 of the bypass stage 1110. The driving stage 1122 has an input node Ndi coupled to the input terminal Pin, a first driving node Nd1 coupled to the first node Nl1 of the loading stage 1121 and a second driving node Nd2 coupled to the second node Nl2 of the loading stage 1121. When the push-pull LNA 1000 is in a first gain mode (for example, a high gain mode), the loading stage 1121 is enabled and the bypassing stage 1110 is disabled, and the driving stage 1122 delivers a driving current into the loading stage 1121 to generate the output signal Sout; and when the push-pull LNA 1000 is in a second gain mode (for example, a low gain mode), the loading stage 1121 is disabled and the bypassing stage 1110 is enabled, and the driving current generated by the driving stage 1122 is sent into the bypass stage 1110 and therefore does not contribute to the output signal Sout. Since all direct currents are conducted to a loading element regardless of whether the LNA is in a high gain mode or in a low gain mode, the push-pull LNA 1000 is capable of achieving the goal of current reuse.

Figure 2:
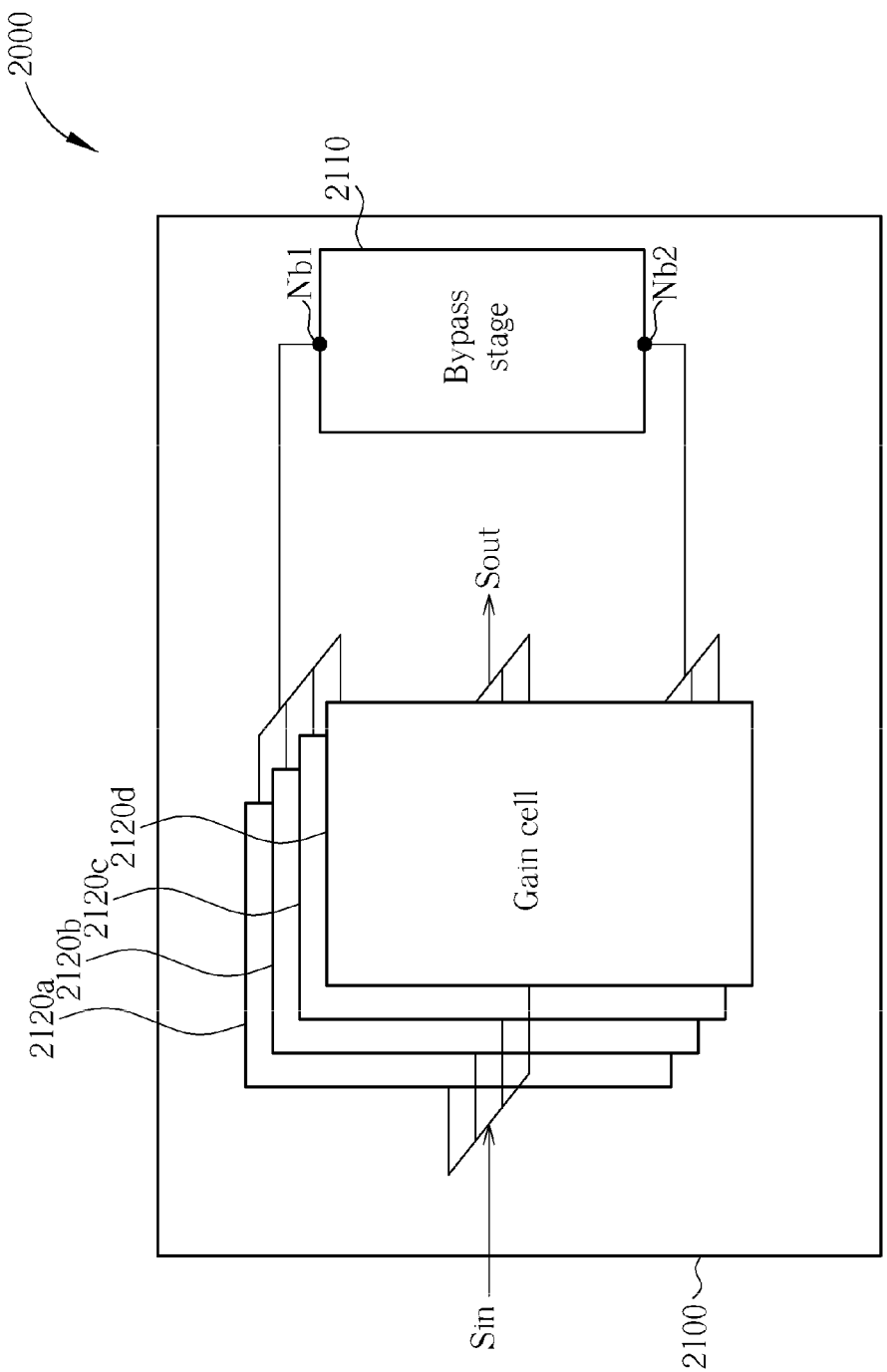
FIG. 2 is a diagram of a push-pull LNA according to another embodiment of the present invention.

The push-pull LNA 1000 may include multiple amplifier blocks to provide a variety of gain selections according to different design requirements. For example, please refer to FIG. 2, which is a diagram of a push-pull low noise amplifier (LNA) 2000 according to another embodiment of the present invention. The push-pull LNA 2000 includes (but is not limited to) an amplifier block 2100 which has a bypass stage 2110 and multiple gain cells 2120a, 2120b, 2120c, 2120d. The functionality and structures of the gain cells 2120a, 2120b, 2120c, 2120d are substantially identical to the gain cell 1120 shown in FIG. 1, and the operation of the bypass stage 2110 is identical to the bypass stage 1110 in FIG. 1. Further description is omitted here for brevity. In the illustrated embodiment of FIG. 2, the four gain cells 2120a, 2120b, 2120c, 2120d share one identical bypass stage 2110. When the push-pull LNA 2000 is in a low gain mode, the loading stage of each gain cell is disabled and the bypassing stage 2110 is enabled to conduct all the driving currents; when the push-pull LNA 2000 is in a high gain mode, the loading stage of each gain cell is enabled and the bypassing stage 2110 is disabled.

Figure 3:
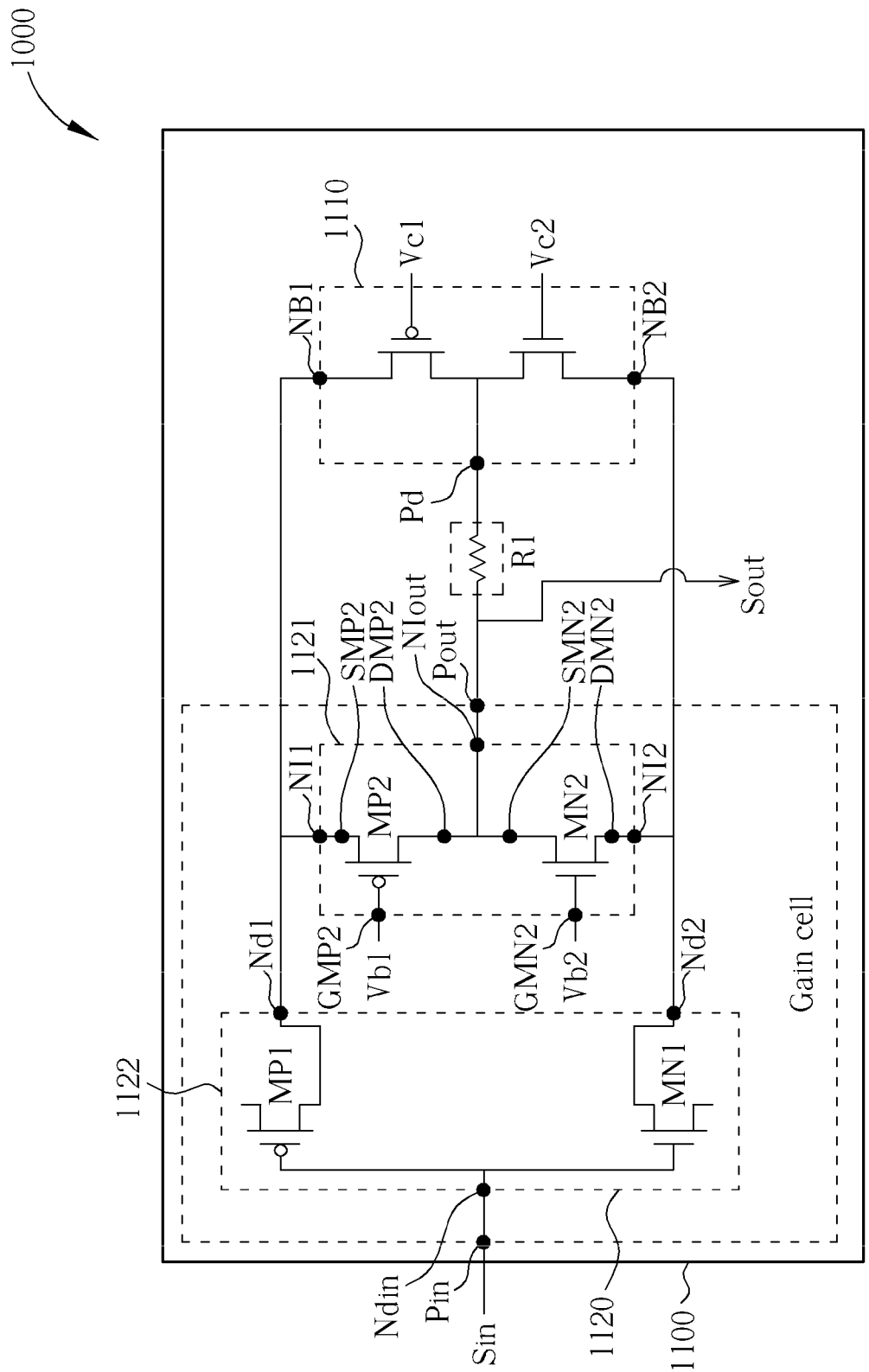
FIG. 3 is an exemplary structural diagram of the push-pull LNA 1000 in FIG. 1 according to an embodiment of the present invention.

FIG. 3 is an exemplary structural diagram of the push-pull LNA 1000 according to an embodiment of the present invention. The driving stage 1122 includes a pushing element (for example, a P-type transistor MP1) and a pulling element (for example, an N-type transistor MN1). The pushing element, i.e., the P-type transistor MP1, has a first input node (a gate control node GMP1 of the PMOS transistor MP1) coupled to the input node Ndin of the driving stage 1122 and a first output node (e.g., a drain node DMP1 of the PMOS transistor MP1) coupled to the first driving node Nd1 of the driving stage 1122. The pulling element, i.e., the N-type transistor MN1, has a second input node (a gate control node GMN1 of the Ntype transistor MN1) coupled to the input node Ndin of the driving stage 1122 and a second output node (e.g., a drain node DMN1 of the NMOS transistor MN1) coupled to the second driving node Nd2 of the driving stage 1122.

The loading stage 1121 in this embodiment includes a P-type transistor MP2 and an N-type transistor MN2. The P-type transistor MP2 has a control node (i.e., the gate control node GMP2) coupled to a first bias voltage Vb1, a first node (i.e., the drain node DMP2) coupled to the output node Nlout of the loading stage 1121 and a second node (i.e., the source node SMP2) coupled to the first node Nb1 of the bypass stage 1110. The N-type transistor MN2 has a control node (i.e., the gate control node GMN2) coupled to a second bias voltage Vb2, a first node (i.e., the drain node DMN2) coupled to the output node Nlout of the loading stage 1121 and a second node (i.e., the source node SMN2) coupled to the second node Nb2 of the bypass stage 1110, wherein the first bias voltage Vb1 and the second bias voltage Vb2 are for controlling switching operations of the P-type transistor MP2 and the N-type transistor MN2, respectively. Please note that this embodiment exploits an active load, which comprises the P-type transistor MP2 and the N-type transistor MN2, as the loading stage 1121; however, this is not supposed to be a limitation of the present invention. The loading stage 1121 can also be implemented with other loading elements such as passive resistors.

Please refer to FIG. 3 again. The bypass stage 1110 in this embodiment is realized by a structure similar to the loading stage, therefore further details on the architecture are omitted here for brevity. The bypass stage 1110 is composed of a P-type transistor MP3 and an N-type transistor MN3, and two control voltages Vc1 and Vc2 are fed to the bypass stage 1110 to control the switching operations of the P-type transistor MP3 and the N-type transistor MN3 therein, respectively. When the push-pull LNA 1000 is switched to the high gain mode, the bias voltages Vb1 and Vb2 are set to high to deliver driving signals from the driving stage 1122 to the output terminal Pout via the P-type transistor MP1 and the N-type transistor MN1, whereas the control voltages Vc1 and Vc2 are set to low to isolate the bypass stage 1110 from the driving stage 1122; when the push-pull LNA 1000 is switched to the low gain mode, the bias voltages Vb1 and Vb2 are set to low to isolate the loading stage 1121 from the driving stage 1122, whereas the control voltages Vc1 and Vc2 are set to high to bypass the driving signals from the driving stage 1122. Please note that, in FIG. 3, the bypass stage 1110 has a bias terminal Pd (which is a counterpart of the output node Nlout of the loading stage 1121), and the bias terminal Pd is coupled to the output node Nlout of the loading stage 1121 via a direct current (DC) choke element; in this exemplary embodiment, the DC choke element is implemented by a resistor R1 for simplicity and compactness; however, this is not supposed to be a limitation of the present invention. The DC choke element can also be realized by the other circuitry such as an inductor.

Figure 4:
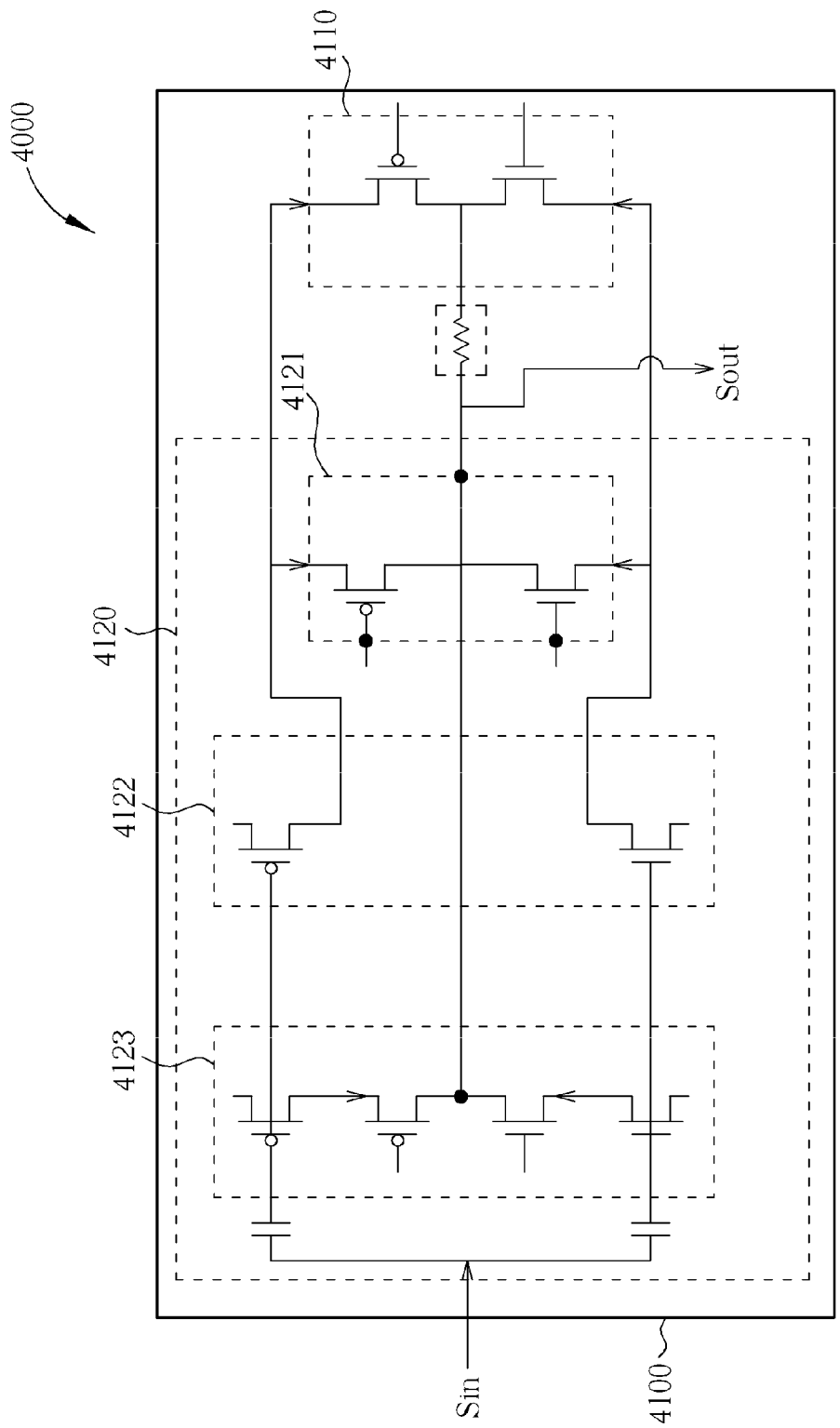
FIG. 4 is a diagram of a push-pull LNA according to another embodiment of the present invention.

Please refer to FIG. 4, which is a diagram of a push-pull LNA 4000 according to another embodiment of the present invention. Compared with the push-pull LNA 1000 in FIG. 3, an additional basic gain cell 4123 is disposed in the gain cell 4120 of the push-pull LNA 4000 to provide a constant gain, while the other components within the push-pull LNA 4000 are identical to those in the push-pull LNA 1000, with the basic gain cell 4123, the push-pull LNA 4000 being able to provide a minimum gain regardless of switching operations within the loading stage 4121 and the bypass stage 4110. Please note that, in the exemplary embodiment of FIG. 4, the basic gain cell 4123 is implemented with a structure similar to a combination of the driving stag 4122 and the loading stage 4121; however, this is not supposed to be a limitation of the present invention, and the basic gain cell 4123 can be constructed with a variety of amplifier architectures according to different design requirements.

Figure 5:
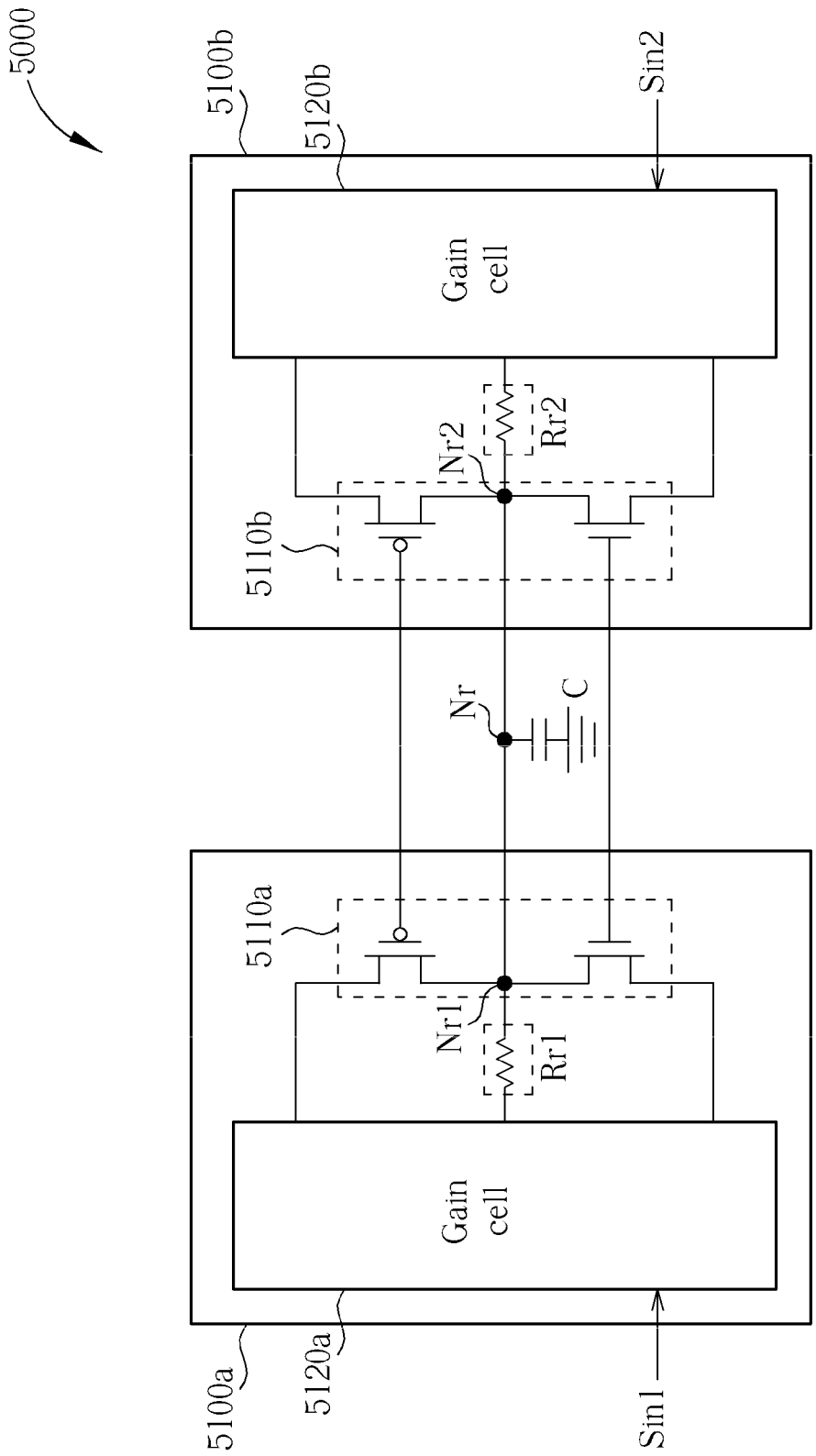
FIG. 5 is a diagram of a differential push-pull LNA according to another embodiment of the present invention.

In addition to the single-ended structure, the push-pull LNAs shown in FIG. 3 and FIG. 4 can also be exploited in a differential architecture. Please refer to FIG. 5, which is a diagram of a differential push-pull LNA 5000 according to another embodiment of the present invention. The differential push-pull LNA 5000 includes two amplifier blocks 5100a and 5100b. The amplifier block 5100a (which has an identical structure to the amplifier 1100b) includes a bypass stage 5110a, and a gain cell 5120a. Those components within the amplifier block 5100a have respective functionalities identical to the corresponding ones in the amplifier block 1100, and further details are omitted here. The bypass stage 5110a has a reference node Nr1, whereas the bypass stage 5110b has a counterpart of a reference node Nr2. In the exemplary embodiment in FIG. 5, the reference node N0 and reference node Nr2 are connected together to form a common reference node Nr for providing a virtual ground. Specifically, a capacitor C can be disposed within the push-pull LNA 5000 to connect the common reference node Nr to a reference ground. In this way, when an imbalance occurs at the differential inputs Sin1 and Sin2 of the push-pull LNA 5000, the transmission path from the common reference node Nr to the reference ground will bypass the imbalanced signal and a better performance can be achieved. In addition, the push-pull LNA 5000 utilize two resistors Rr1 and Rr2 (the resistor Rr1 couples the output node of the gain cell 5120a to the node Nr1, and the resistor Rr2 couples the output node of the gain cell 5120b to the node Nr2) to keep bias conditions of the bypass conditions of the bypass stages 5110a and 5110b substantially the same as their corresponding loading stage within the gain cells 5120a and 5120b, respectively. When the differential input signals injected into the push-pull LNA 5000 have an imbalanced term, the resistors Rr1 and Rr2 in conjunction with the capacitor C will form a low-impedance path in even mode such that the imbalance can be alleviated.

Another embodiment of the present invention further provides a common gate (CG) bias circuit to supply a push-pull LNA. Please refer to FIG. 6, which is a diagram of a push-pull LNA 6000 according to an embodiment of the present invention. The push-pull LNA 6000 includes a gain cell 6100 and a CG bias circuit 6200. The gain cell 6100 includes a loading stage 6110 and a loading stage 6120; please note that the gain cell 6100 here has a substantially identical structure to the gain cell 4120 shown in FIG. 4 and therefore further details are omitted here; however, this is not supposed to be a limitation of the present invention, and the gain cell 6100 can also be implemented differently according to various design requirements. The CG bias circuit 6200 includes a first current source for providing a first current I1, a CG transistor MCG, a CG resistor RCG, a voltage bias circuit 6210 and a direct current (DC) choke element 6220. The CG transistor MCG has a control node GMCG (i.e., the gate control node) for receiving a constant bias voltage Vbias from the voltage bias circuit 6210, a first node DMCG (i.e., the drain node) for receiving the first bias current I1 and a second node SMCG (i.e., the source node). The CG resistor RCG has a first node NRCG1 coupled to the second node SMCG of the CG transistor MCG and a second node NRCG2 coupled to the output terminal Pout of the gain cell 6100 for receiving an output signal Sout. The CG transistor MCG thereby receives the output signal Sout via the CG resistor RCG and generates a bias signal Vcg, and the DC choke element 6220, which is implemented with a resistor in this embodiment, connects the first node DMCG of the CG transistor MCG to a control node of a transistor within the driving stage 6120. In this embodiment, the DC choke element 6220 is coupled to a gate control node of a P-type transistor within the driving stage 6120 to provide a bias condition; however, with a proper modification, the CG bias circuit 6200 can also be utilized to provide a bias condition for an N-type transistor within the driving stage 6120. Please note that in this embodiment, the CG transistor MCG and the P-type transistors within the gain cell 6100 form a closed loop to stabilize the bias condition.

Figure 6:
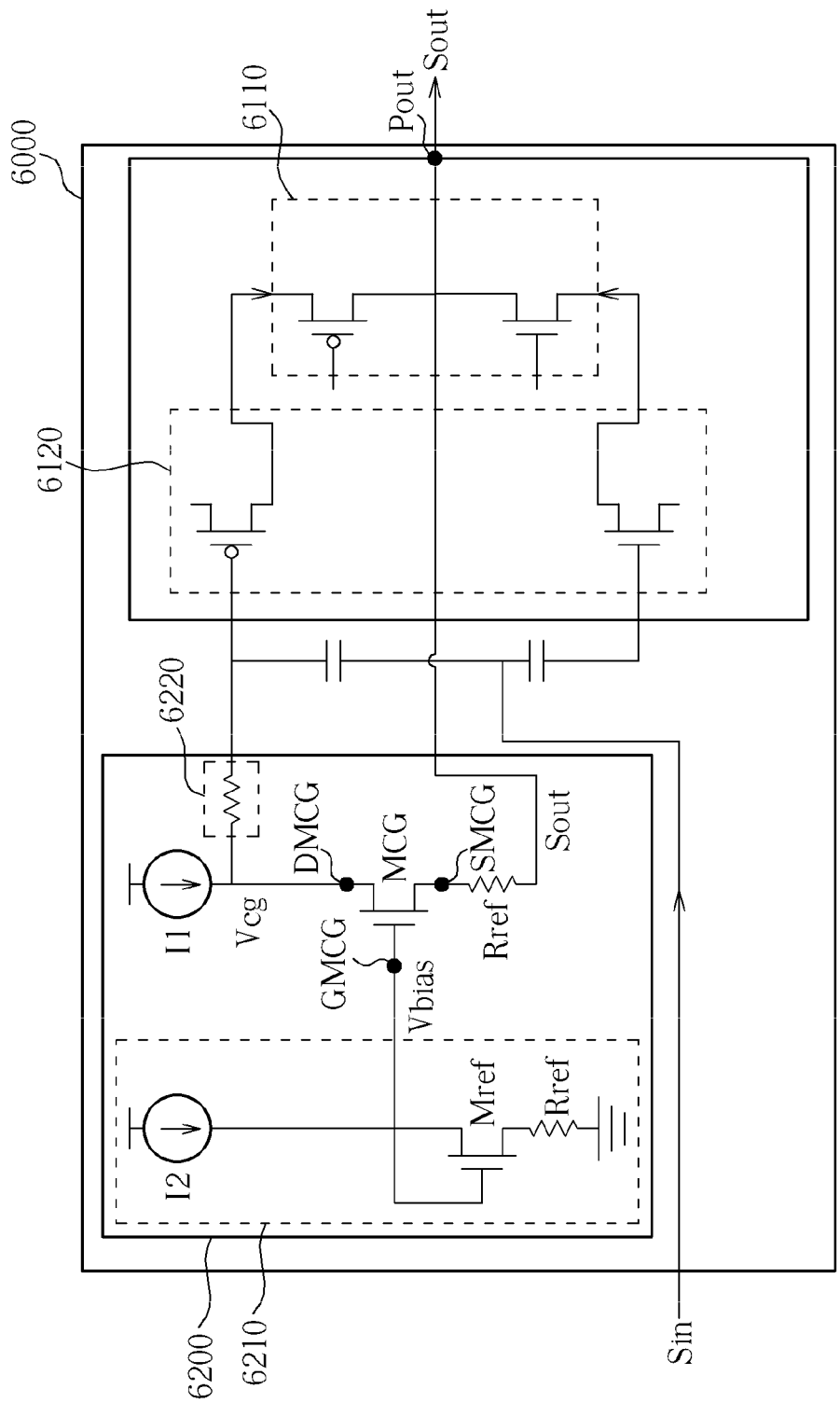
FIG. 6 is a diagram of a push-pull LNA according to an embodiment of the present invention.

The voltage bias circuit 6120 shown in FIG. 6 includes a second current source, a reference transistor Rref, and a reference transistor Mref. The reference transistor Mref has a control node (i.e., the gate control node), a first node (i.e., the drain node) coupled to the control node GMCG of the CG transistor MCG that also receives a second bias current I2 from the second current source, and a second node (i.e., a source node). The reference resistor Rref has a first node coupled to the second node of the reference transistor Mref and a second node coupled to a reference ground. Please note that, in this embodiment, a gate-source voltage Vgs_CG of the CG transistor MCG is designed to be identical to a gate-source voltage Vgs_ref of the reference transistor Mref, and the CG resistor RCG and the reference resistor Rref are designed to be identical doping types, i.e., the CG resistor RCG and the reference resistor Rref have identical temperature variation coefficients. From FIG. 6, an equation can be derived as follows:

$$Sout=(I2\times Rref+Vgs\_{ref})-(I1\times RCG+Vgs\_CG) \qquad (1)$$

Since Vgs_ref is designed to be identical to Vgs_CG, the equation (1) can be simplified as follows:

$$Sout=(I2\times Rref)-(I1\times RCG) \qquad (2)$$

Please note that the output signal Sout here refers to a voltage signal. Both I1 and I2 are derived from a stable bandgap voltage Vbg, for example, I1=Vbg/Rbg1, I2=Vbg/Rbg2, wherein Rbg1 and Rbg2 are resistors of an identical doping type as the CG resistor RCG and the reference resistor Rref. In this case, the temperature variation coefficients of Rbg1 and Rref will cancel out and so will the Rbg2 and RCG. Therefore, the output voltage Sout of the gain cell 6100 will be stable when subjected to a fluctuation of PVT (process, voltage, temperature) variation.

Figure 7:
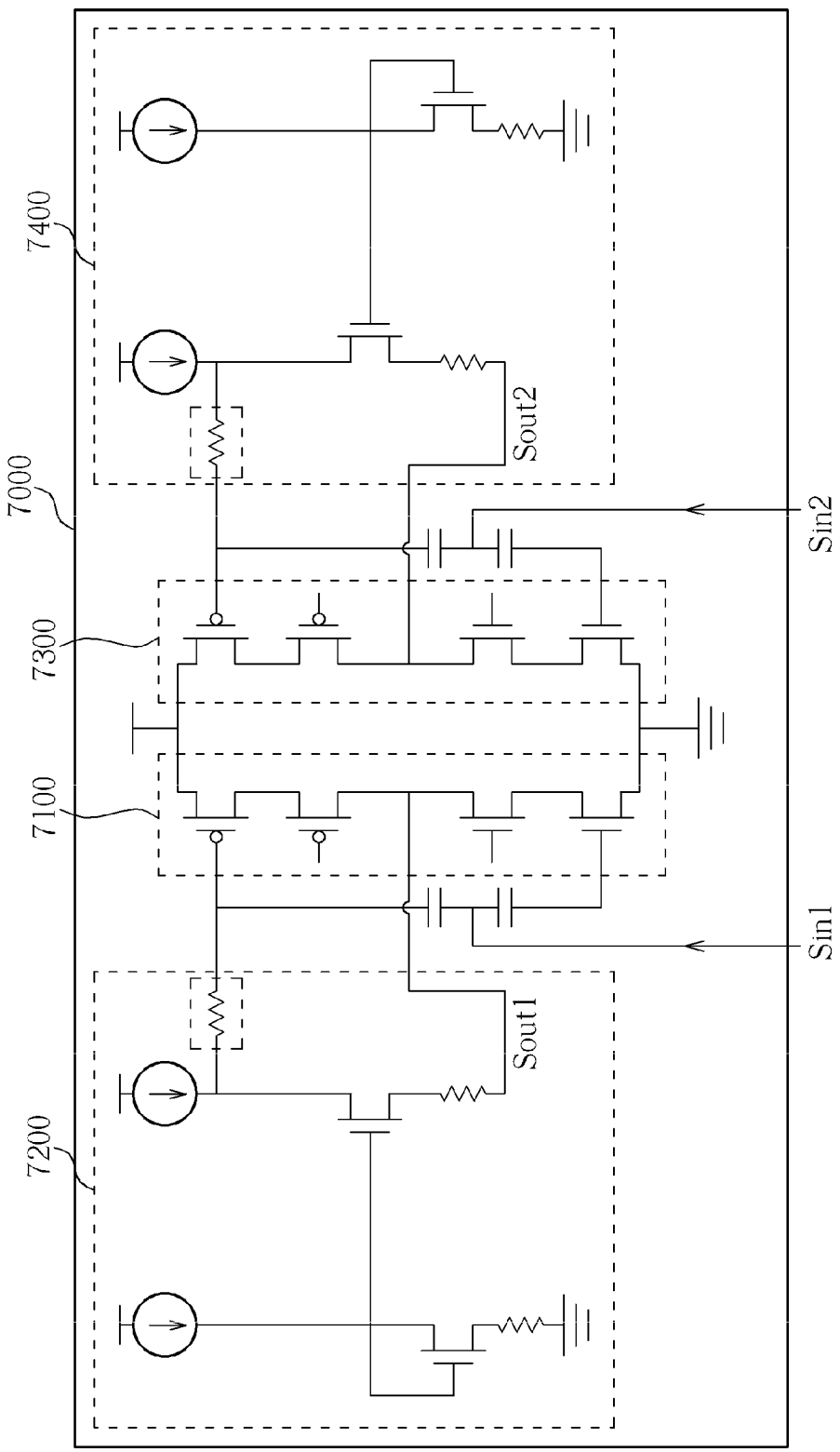
FIG. 7 is a differential push-pull LNA utilizing two CG bias circuits for biasing according to an embodiment of the present invention.

In addition, the CG bias circuit 6200 can also be utilized in a differential structure. Please refer to FIG. 7, which is a differential push-pull LNA 7000 utilizing two CG bias circuits 7200 and 7400 for biasing according to an embodiment of the present invention. The differential push-pull LNA 7000 includes two amplifier blocks 7100 and 7300 for receiving a first input signal Sin1 and a second input signal Sin2, respectively, and includes two CG bias circuits 7200 and 7400 for biasing the two amplifier blocks 7100 and 7300, respectively. The amplifier blocks 7100, 7300 and CG bias circuits 7200, 7400 are identical to the amplifier 6100 and CG bias circuit 6200, respectively; therefore further details are omitted here. Please note that the CG bias circuit 6200 receives a first output signal Sout1 from the amplifier block 7100 to generate a first bias voltage Vb1 to a P-type transistor in the amplifier block 7100. In addition, the embodiment of FIG. 7 utilizes two separate CG bias circuits 7200 and 7400 for biasing the differential push-pull LNA 7000, even if an imbalance occurs at the differential input of the differential push-pull LNA 7000 due to balun mismatch, the common mode voltage within the differential push-pull LNA 7000 is still well-defined since the differential branches are biased separately. The CG bias circuit 6200 can also be modified to provide a bias condition for an N-type transistor in the amplifier block 7100.

Still another embodiment of the present invention further provides an auxiliary matching circuit for an amplifier. Please refer to FIG. 8, which is a diagram of an amplifier 8000 according to an embodiment of the present invention. The amplifier 8000 includes an amplifier block 8100 and an auxiliary matching circuit 8200. The amplifier block 8100 has an input terminal Pin_a for receiving an input signal Sin and an output terminal Pout_a for outputting an output signal Sout. The auxiliary matching circuit 8200 has a matching node Nmatch coupled to the input terminal Pin_a of the amplifier block 8100, and includes a gain cell 8210 and a feedback cell 8220. The gain cell 8210 has a first node Ng1 coupled to the matching node Nmatch of the auxiliary matching circuit 8200 and a second node Ng2. The feedback cell 8220 has a first node Nfb1 coupled to the second node Ng2 of the gain cell 8210 and a second node Nfb2 coupled to the matching node Nmatch of the auxiliary matching circuit 8200, wherein a signal at the second node Ng2 of the gain cell 8210 and a signal at the first node Nfb1 of the feedback cell 8220 are electrically isolated from a signal at the output terminal Pout_a of the amplifier block 8100, i.e., the output signal Sout of the amplifier block 8100 is not affected by the operation of the auxiliary matching circuit 8200.

Figure 8:
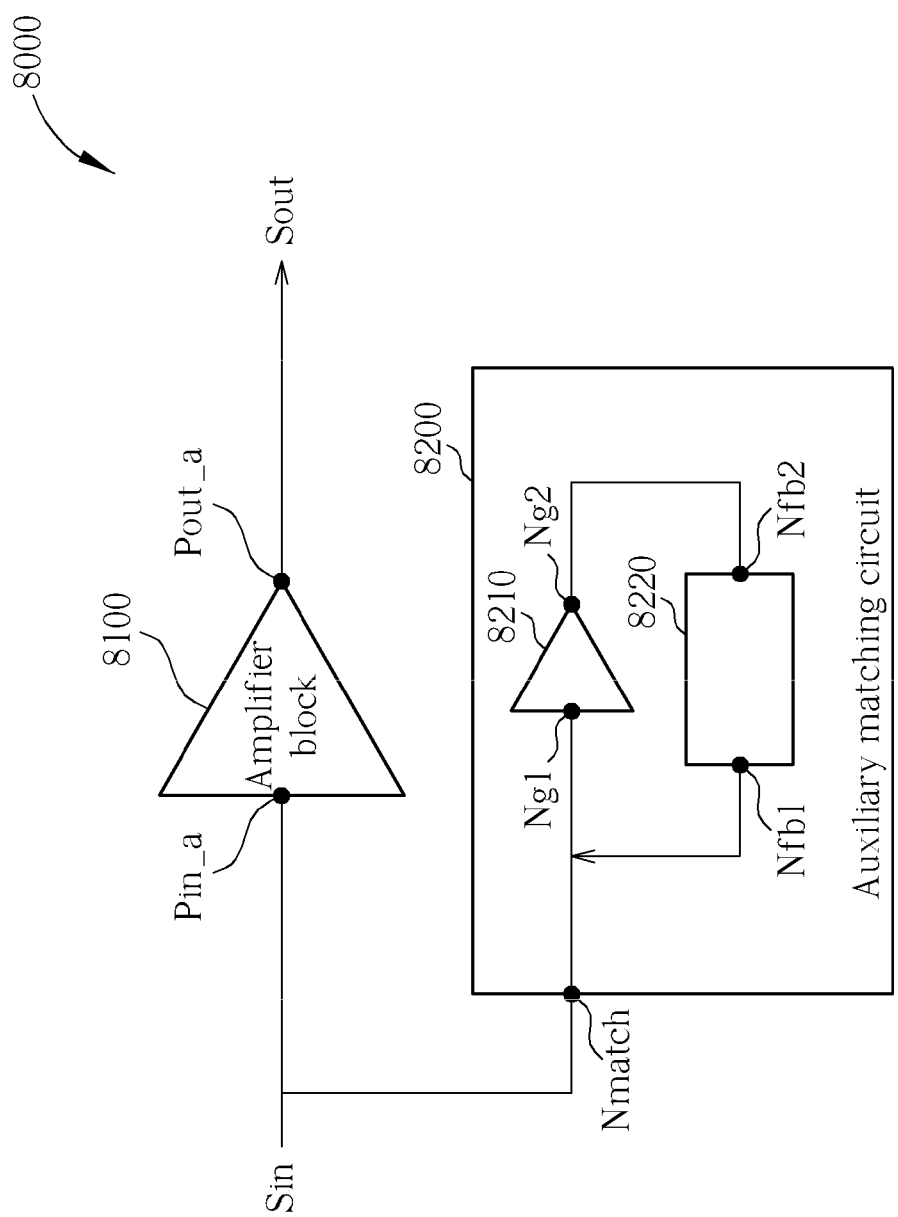
FIG. 8 is a diagram of an amplifier according to an embodiment of the present invention.
Figure 9A:
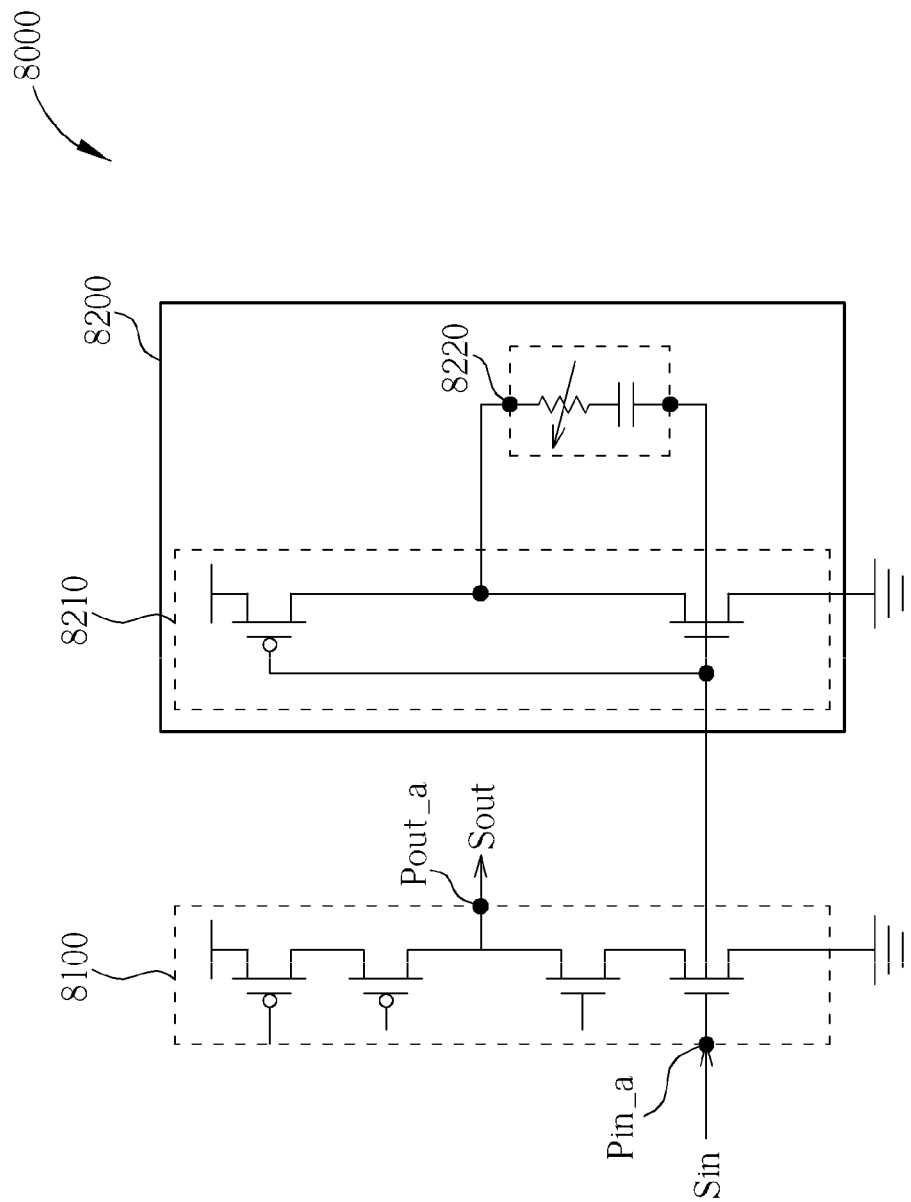
FIG. 9A is a structural diagram of the amplifier 8000 in FIG. 8 according to an embodiment of the present invention.
Figure 9B:
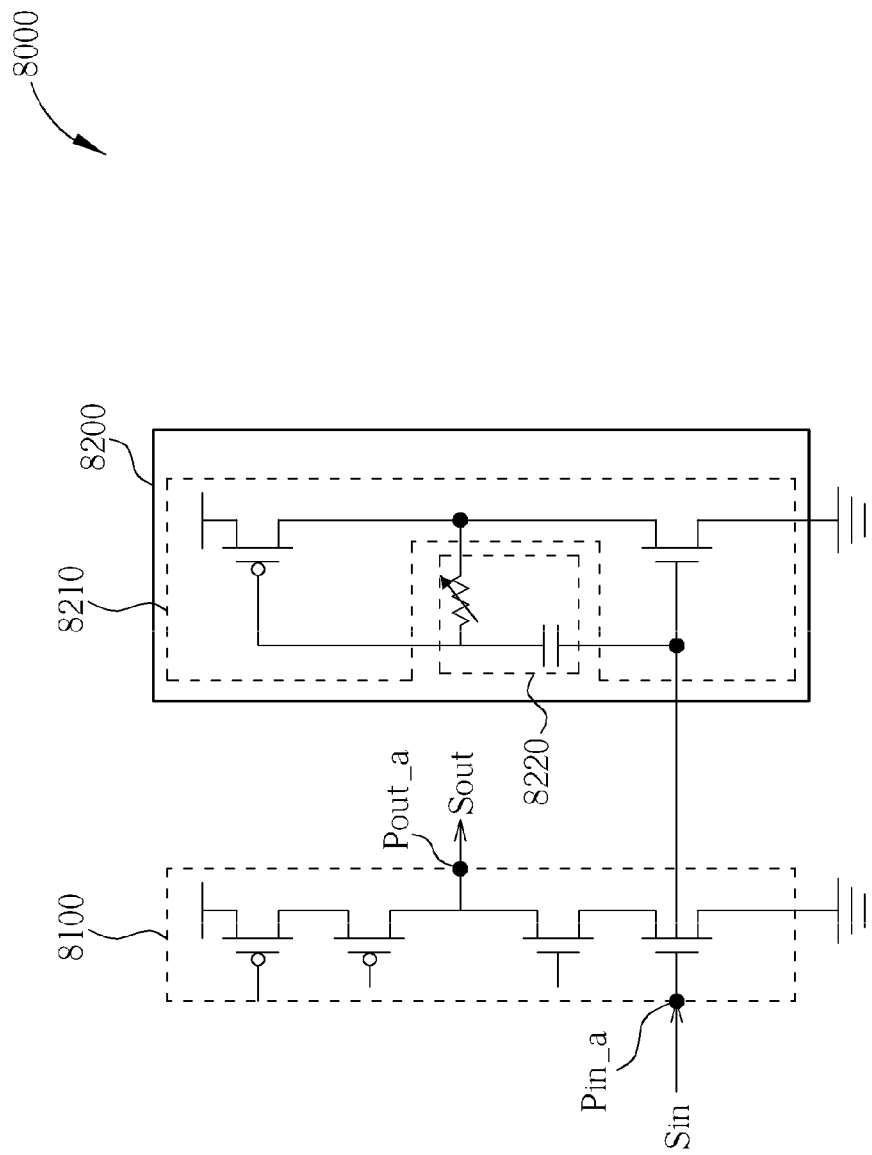
FIG. 9B is a structural diagram of the amplifier 8000 in FIG. 8 according to another embodiment of the present invention.

FIG. 9A is a structural diagram of the amplifier 8000 according to an embodiment of the present invention. In the example shown in FIG. 8, the amplifier block 8100 is implemented with a push-pull amplifier and an active load, and the gain cell 8210 is implemented with a complementary push-pull amplifier, however, this is not supposed to be a limitation to the present invention. Either the amplifier block 8100 or the gain cell 8210 can be implemented by any kind of amplifier circuit. FIG. 9B demonstrates another simple structure to implement the matching circuit 8200. In the example of FIG. 9B, the N-type transistor within the gain cell 8210 and the feedback cell 8220 form a closed loop, and the P-type transistor within the gain cell 8210 provides an additional gain. In addition, since a push-pull amplifier structure has a large input impedance and a small output impedance, the amplifier block 8100 shown in FIG. 9A is suitable to operate in a current mode to receive an input current signal Sin at the input terminal Pin_a and deliver an output current signal Sout at the output terminal Pout_a. The feedback cell 8220 in this example is realized with a feedback resistor in series with a feedback capacitor. Please note that the feedback resistor can be implemented as a variable resistor and can be adjusted according to different design requirements, e.g., when the amplifier 8000 is disposed in a wideband system, the value of the feedback resistor can be freely adjusted to comply with specifications of various communication standards. For example, one single amplifier 8000 can be adjusted to comply with receiver specifications of wireless standards such as 2G SAWless, 3G SAWless and TD-SCMDMA without difficulty.

Figure 9C:
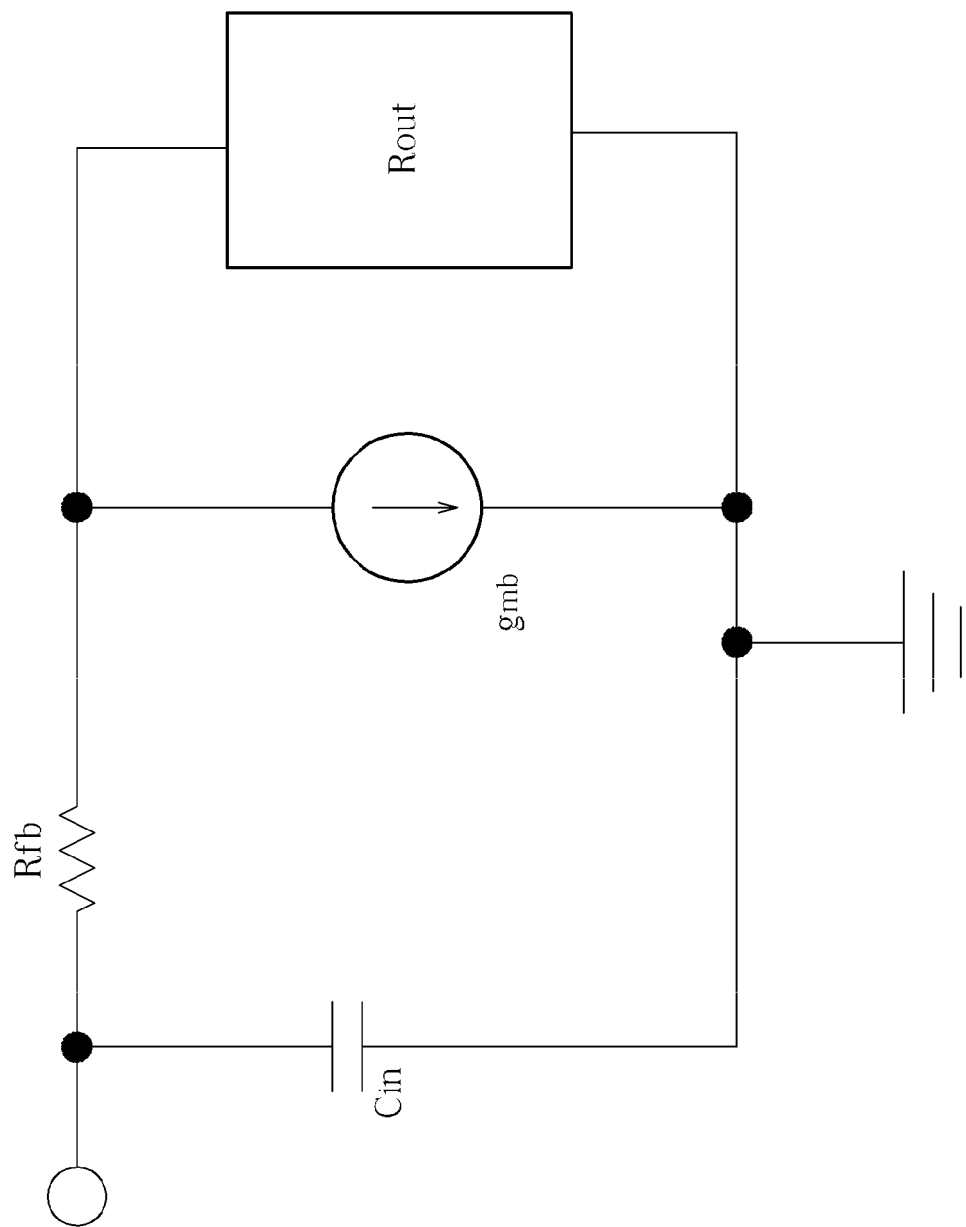
FIG. 9C is an exemplary diagram of a simplified circuit model of the auxiliary matching circuit according to an embodiment of the present invention.

FIG. 9C is an exemplary diagram of a simplified circuit model of the auxiliary matching circuit according to an embodiment of the present invention, wherein Cin represents an equivalent capacitor looking into a matching node of the auxiliary matching circuit (e.g., the matching node Nmatch in FIG. 8), Rfb represent a feedback resistor, Rout represents an equivalent output loading and $g_{mb}$ represents a voltage-controlled current source. The input admittance of the simplified circuit model in FIG. 9C can be written as follows:

$$Yin = S \cdot Cin + \frac{1 + g_{mb} \cdot Rout}{Rout + Rfb} \quad (3)$$

It can be further deduced that the matching function is related to Rout, Rfb and the intrinsic gain of the auxiliary matching circuit. Compared with the traditional LNA with inductor degeneration, the matching functions of the auxiliary matching circuit for both impedance and noise are decoupled from inductor or a gain provided the gain cell, these features make the present embodiment not only a compact solution to the design of an LNA but also an effective topology with good performance.

Figure 10:
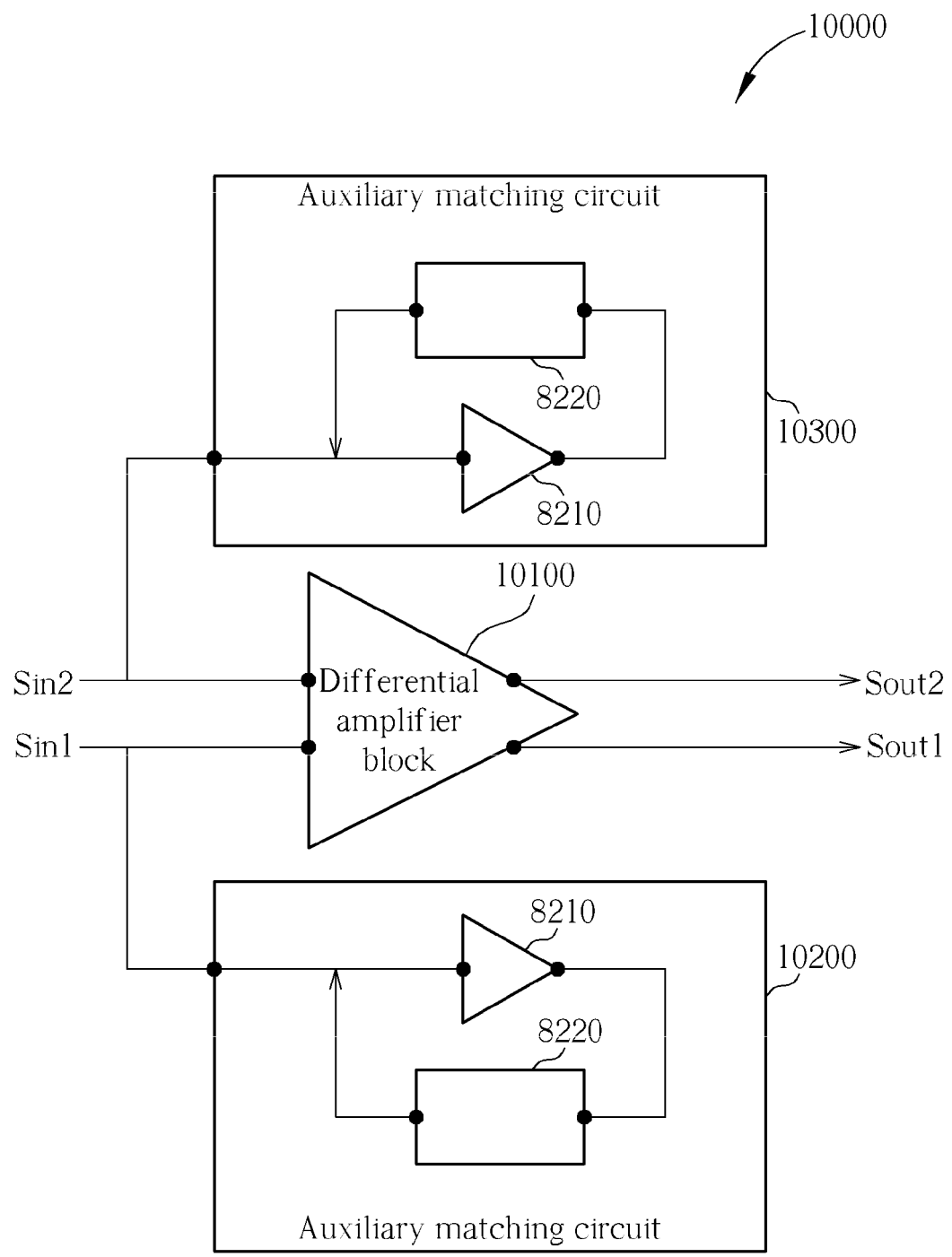
FIG. 10 is a diagram of a differential amplifier according to another embodiment of the present invention.

In addition to a single-ended structure, the amplifiers shown in FIG. 8 and FIG. 9A can also be exploited in a differential architecture. Please refer to FIG. 10, which is a diagram of a differential amplifier 10000 according to another embodiment of the present invention. A differential amplifier block 10100 receives two differential input signals Sin1 and Sin2 and generates two differential output signals Sout1 and Sout2. Two auxiliary matching circuits 10200 and 10300, which both have identical structures to the auxiliary matching circuit 8200 shown in FIG. 8, are connected to two input terminals of the differential amplifier block 10100, respectively. In this case, the two auxiliary matching circuits 10200 and 10300 are capable of providing proper matching for the differential amplifier block 10100 over a wide frequency without affecting output performance of the differential amplifier block 10100.

The structures shown in FIGS. 8 and 9 can also be implemented in the design of an LNA and, with the help of the auxiliary matching circuit 8200, can achieve good matching over a wide frequency range. Compared with a traditional LNA, which utilizes large on-chip inductors for matching, the amplifier 8000 can achieve a compact size and a wideband matching simultaneously.

Figure 11:
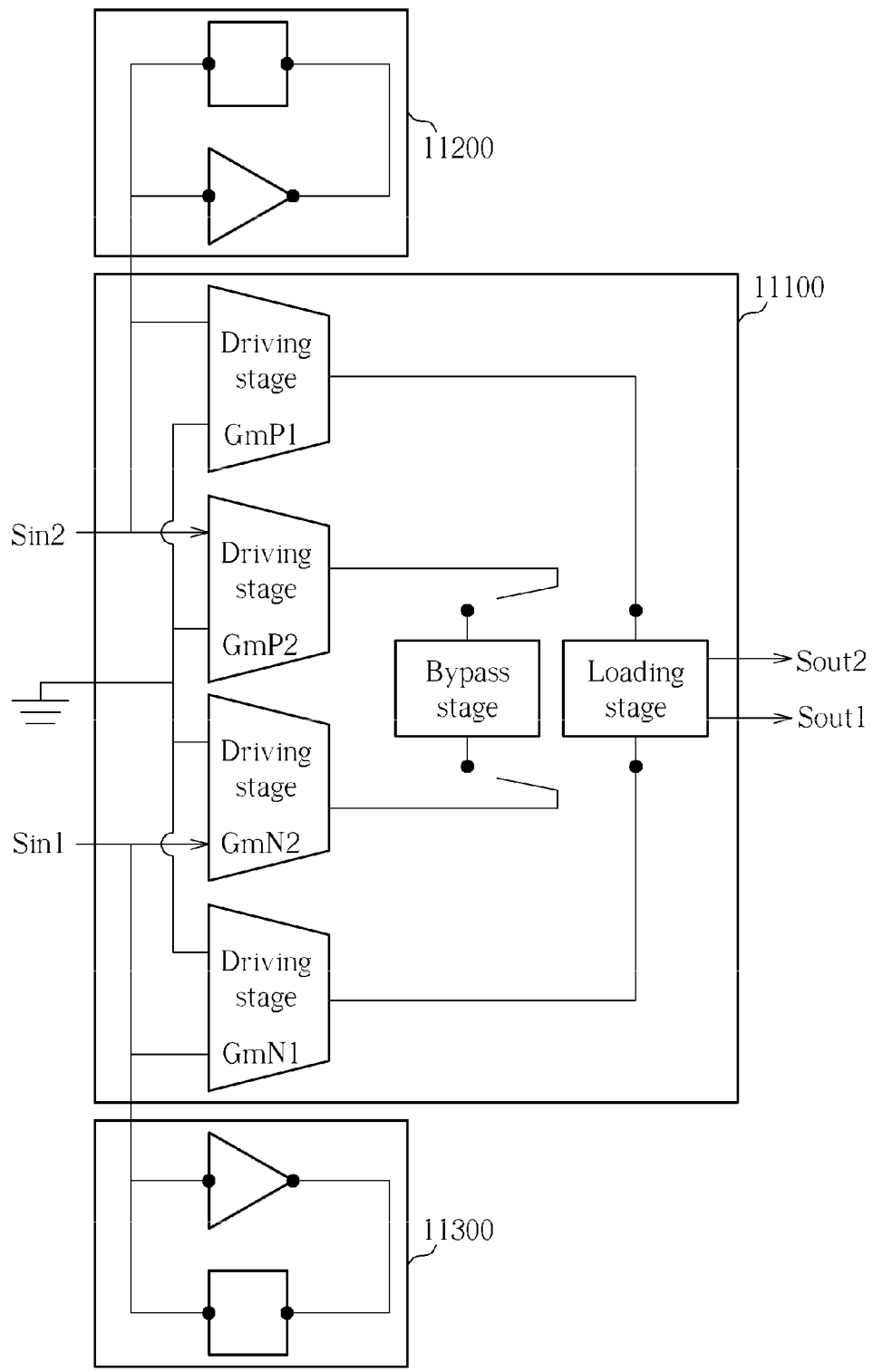
FIG. 11 is an exemplary diagram of a push-pull amplifier implemented with auxiliary matching circuits according to an embodiment of the present invention.

The circuit structures disclosed in the previous embodiments can be utilized independently or be integrated jointly. For example, the push-pull LNA 5000 shown in FIG. 5 can be integrated with the CG bias circuit 6200 shown in FIG. 6, the auxiliary matching circuit 8200 shown in FIG. 8 or integrated with both. Please refer to FIG. 11, which is an exemplary diagram of a push-pull amplifier 11100 implemented with auxiliary matching circuits 11200 and 11300 according to an embodiment of the present invention. The push-pull amplifier 11100 receives differential input signals Sin1 and Sin2 to produce output signals Sout1 and Sout2 accordingly. The functionality and structure of the push-pull amplifier 11100, which includes driving stages with gain GmP1, GmP2, GmN1 and GmN2, are identical to the differential push-pull LNA 5000 shown in FIG. 4, and the auxiliary matching circuits 11200 and 11300 are identical to the auxiliary matching circuit 8200 shown in FIG. 8. When the push-pull amplifier 11100 is in a high gain mode, all the driving stages within the push-pull amplifier 11100 will output driving currents into the loading to generate the output signals Sout1 and Sout2, i.e., the driving stages provides a total gain of GmP1+GmP2+GmN1+GmN2; when the push-pull amplifier 11100 is in a low gain mode, the partial driving stages (i.e., the driving stages with gain GmP1 and GmN1) output driving currents into the loading to provide a total gain of GmP1+GmN1 and the other driving stages (i.e., the driving stages with gain GmP2 and GmN2) will output driving currents into the bypass stage and contribute none to the loading stage. In addition, the CG bias circuit 6200 shown in FIG. 6 can also be integrated into the circuitry shown in FIG. 11 without difficulty.

Figure 12:
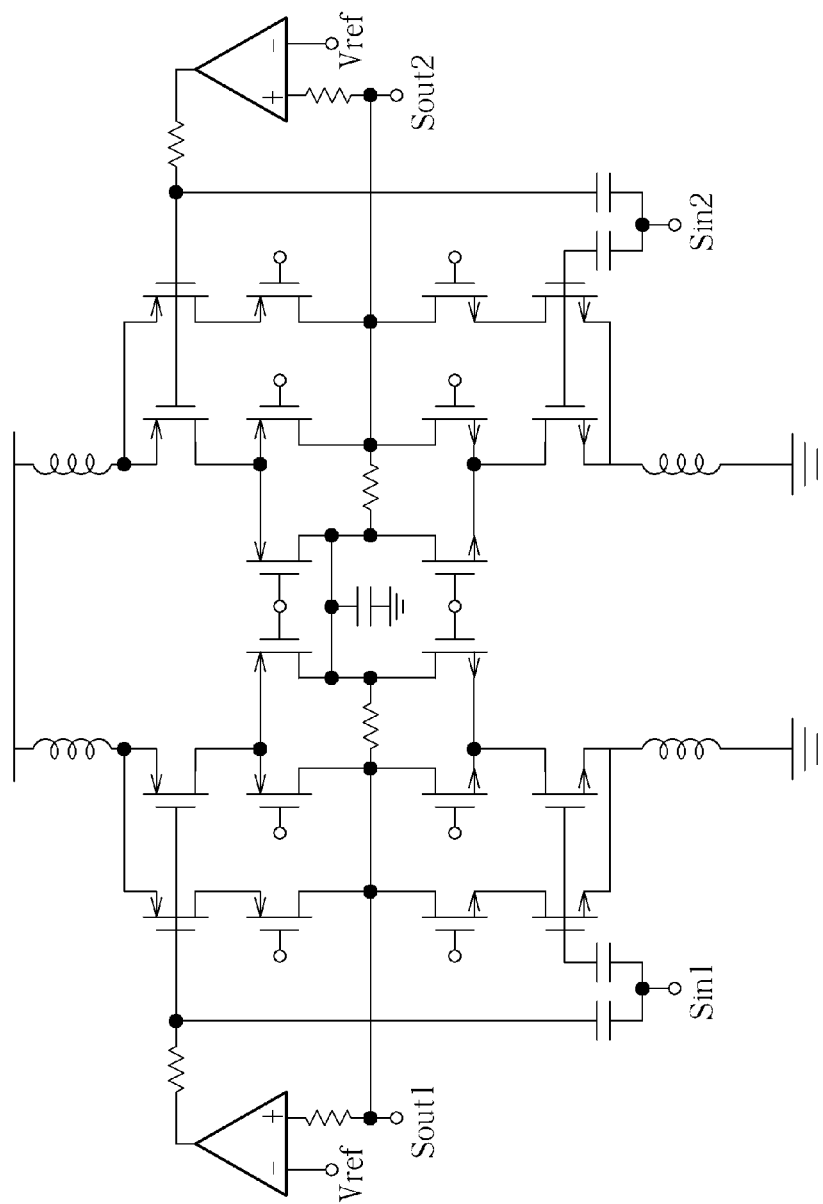
FIG. 12 is an exemplary diagram of a differential amplifier with variable gain and inductor degeneration according to an embodiment of the present invention.

Please refer to FIG. 12, which is an exemplary diagram of a differential amplifier with variable gain and inductor degeneration according to an embodiment of the present invention. The differential amplifier in FIG. 12 utilizes inductors for input matching and two bypass stages for gain selection, each differential branch has an OP amplifier to receive a reference voltage Vref and an output signal and to output a bias voltage for biasing, please note that the OP amplifier and the P-type transistors in each differential branch form a closed loop to stabilize the bias condition. This kind of design also falls within the scope of the present invention.

To summarize, the embodiments of the present invention provide a push-pull LNA with a stable performance and a gain range, a common gate bias circuit with stable performance over PVT variation and an auxiliary matching circuit utilizing feedback mechanism to provide a wideband matching without affecting inherent output signals. The above circuits can be employed independently or integrated jointly to achieve a wideband operation and compactness.

Those skilled in the art will readily observe that numerous modifications and alterations of the device and method may be made while retaining the teachings of the invention.

What is claimed is:

1. A push-pull low noise amplifier (LNA), comprising:
at least one amplifier block, each amplifier block comprising:
a bypass stage, having a first node and a second node; and
at least one gain cell, having an input terminal and an output terminal, comprising:
a loading stage, having an output node coupled to the output terminal, a first node coupled to the first node of the bypass stage and a second node coupled to the second node of the bypass stage; and
a driving stage, having an input node coupled to the input terminal, a first driving node coupled to the first node of the loading stage and a second driving node coupled to the second node of the loading stage;
wherein when the push-pull LNA is in a first gain mode, the loading stage is enabled and the bypassing stage is disabled; and when the push-pull LNA is in a second gain mode, the loading stage is disabled and the bypassing stage is enabled.

2. The push-pull LNA of claim 1, wherein each amplifier block comprises a plurality of the gain cell.

3. The push-pull LNA of claim 1, wherein the driving stage comprises:
a pushing element, having a first input node coupled to the input node of the driving stage and a first output node coupled to the first driving node of the driving stage; and
a pulling element, having a second input node coupled to the input node of the driving stage and a second output node coupled to the second driving node of the driving stage.

4. The push-pull LNA of claim 3, wherein the pushing element comprises:
a P-type transistor, having a control node coupled to the first input node of the pushing element, and a pushing node coupled to the first output node of the pushing element; and
the pulling element comprises:
an N-type transistor, having a control node coupled to the second input node of the pulling element, and a pulling node coupled to the second output node of the pulling element.

5. The push-pull LNA of claim 1, wherein the loading stage comprises:
a P-type transistor, having a control node coupled to a first bias voltage, a first node coupled to the output node of the loading stage and a second node coupled to the first node of the bypass stage; and
an N-type transistor, having a control node coupled to a second bias voltage, a first node coupled to the output node of the loading stage and a second node coupled to the second node of the bypass stage.

6. The push-pull LNA of claim 1, wherein the bypass stage comprises:
an N-type transistor, having a control node coupled to a first bias voltage, a first node and a second node coupled to the first node of the loading stage; and
a P-type transistor, having a control node coupled to a second bias voltage, a first node coupled to the first node of the N-type transistor and a second node coupled to the second node of the loading stage.

7. The push-pull LNA of claim 1, wherein the bypass stage has a bias terminal, and the bias terminal is coupled to the output node of the loading stage via a direct current (DC) choke element.

8. The push-pull LNA of claim 1, further comprising:
a common gate (CG) bias circuit, comprising:
a CG transistor, having a control node for receiving a bias voltage, a first node for receiving a first bias current and a second node;
a resistor, having a first node coupled to the second node of the CG transistor and a second node coupled to the output terminal of the at least one gain cell; and
a direct current (DC) choke element, having a first node coupled to the first node of the CG transistor and a second node coupled to a control node of at least one transistor of the driving stage.

9. The push-pull LNA of claim 1, further comprising:
an auxiliary matching circuit, having a matching node coupled to the input terminal of the gain cell, comprising:
a gain cell, having a first node coupled to the matching node of the auxiliary matching circuit and a second node; and
a feedback cell, having a first node coupled to the second node of the gain cell and a second node coupled to the matching node of the auxiliary matching circuit;

wherein the second node of the gain cell of the auxiliary matching circuit and the first node of the feedback cell are electrically isolated from the output terminal of the gain cell.

10. The push-pull LNA of claim 1, wherein the amplifier block comprises a plurality of the amplifier blocks
wherein each of the bypass stages further comprises a reference node, and the reference nodes of the bypass stages are coupled to a common reference node.

11. The push-pull LNA of claim 10, wherein the common reference node is coupled to a reference ground voltage via a capacitor.

12. A push-pull low noise amplifier (LNA), comprising:
at least one gain cell, having an input terminal and an output terminal, comprising:
a loading stage, having an output node coupled to the output terminal, a first node, and a second node; and
a driving stage, having an input node coupled to the input terminal, a first driving node coupled to the first node of the loading stage and a second driving node coupled to the second node of the loading stage; and
at least one common gate (CG) bias circuit, comprising:
a CG transistor, having a control node for receiving a bias voltage, a first node for receiving a first bias current and a second node;
a CG resistor, having a first node coupled to the second node of the CG transistor and a second node coupled to the output terminal of the gain cell; and
a direct current (DC) choke element, having a first node coupled to the first node of the CG transistor and a second node coupled to a control node of at least one transistor of the driving stage.

13. The push-pull LNA of claim 12, wherein the DC choke element is implemented by a bias resistor.

14. The push-pull LNA of claim 12, wherein the CG bias circuit further comprises:
a voltage bias circuit, having an output node coupled to the control node of the CG transistor for providing the bias voltage, comprising:
a reference transistor, having a control node, a first node coupled to the control node of the CG transistor for receiving a second bias current, and a second node; and
a reference resistor, having a first node coupled to the second node of the reference transistor and a second node coupled to a reference source.

15. The push-pull LNA of claim 14, wherein a gate-source voltage of the CG transistor corresponds to a gate-source voltage of the reference transistor, and the CG resistor and the reference resistor are of identical doping type.

16. The push-pull LNA of claim 12, wherein the gain cell comprises:
a first gain cell, having a first input terminal arranged to receive a first input signal and a first output terminal arranged to output a first output signal; and
a second gain cell, having a second input terminal arranged to receive a second input signal and a second output terminal arranged to output a second output signal; and
the common CG bias circuit comprises:
a first CG bias circuit, coupled to the first gain cell, arranged to receive the first output signal to provide a first bias signal to the first gain cell; and
a second CG bias circuit, coupled to the second gain cell, arranged to receive the second output signal to provide a second bias signal to the second gain cell;
wherein the first input signal and the second input signal are differential signals.

17. An amplifier, comprising:
at least one amplifier block, having an input terminal and an output terminal; and
at least one auxiliary matching circuit, having a matching node coupled to the input terminal of the amplifier block, comprising:
a gain cell, having a first node coupled to the matching node of the auxiliary matching circuit and a second node; and
a feedback cell, having a first node coupled to the second node of the gain cell and a second node coupled to the matching node of the auxiliary matching circuit;
wherein a signal at the second node of the gain cell and a signal at the first node of the feedback cell are independent of a signal at the output terminal of the amplifier block.

18. The amplifier of claim 17, wherein the feedback cell comprises:
a feedback resistor in series with a feedback capacitor, coupled between the first node and the second node of the feedback cell.

19. The amplifier of claim 17, wherein the amplifier block comprises:
a first amplifier block, having a first input terminal for receiving a first input signal; and
a second amplifier block, having a second input terminal for receiving a second input signal;
the auxiliary matching circuit comprises:
a first auxiliary matching circuit, having a first matching node coupled the first input terminal of the first amplifier block; and
a second auxiliary matching circuit, having a second matching node coupled the second input terminal of the second amplifier block;
wherein the first input signal and the second input signal are differential signals.

20. The amplifier of claim 18, wherein the feedback resistor is a variable resistor.

21. The amplifier of claim 17, wherein the amplifier block comprises a first amplifier block with a first gain and a second amplifier block with a second gain, and the amplifier block provide a gain comprising a combination of the first gain or the second gain selectively.

22. The amplifier of claim 17, wherein the amplifier block operates in a current to receive an input current signal at the input terminal and deliver an output current signal at the output terminal.

* * * * *